(12) United States Patent
Hiraga et al.

(10) Patent No.: US 6,593,215 B2
(45) Date of Patent: Jul. 15, 2003

(54) METHOD OF MANUFACTURING CRYSTALLINE SEMICONDUCTOR MATERIAL AND METHOD OF MANUFACTURING SEMICONDUCTOR DEVICE

(75) Inventors: Toru Hiraga, Kanagawa (JP); Takashi Noguchi, Kanagawa (JP); Setsuo Usui, Kanagawa (JP); Yoshifumi Mori, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/934,241

(22) Filed: Aug. 21, 2001

(65) Prior Publication Data
US 2002/0098695 A1 Jul. 25, 2002

(30) Foreign Application Priority Data
Aug. 22, 2000 (JP) ..................... P2000-251623

(51) Int. Cl.[7] .............................. H01L 21/36
(52) U.S. Cl. ....................... 438/486; 487/437
(58) Field of Search .............. 438/482, 484–490

(56) References Cited

U.S. PATENT DOCUMENTS

| | | | | |
|---|---|---|---|---|
| 4,113,531 A | * | 9/1978 | Zanio et al. | ................. 136/258 |
| 6,005,270 A | * | 12/1999 | Noguchi | ...................... 257/20 |
| 6,322,625 B2 | * | 11/2001 | Im | .............................. 117/43 |

* cited by examiner

Primary Examiner—Jey Tsai
(74) Attorney, Agent, or Firm—Sonnenschein, Nath & Rosenthal

(57) ABSTRACT

Disclosed are a method manufacturing a crystalline semiconductor material capable of improving the crystallinity and a method of manufacturing a semiconductor device using the same. An amorphous film made of silicon (Si) is formed on a substrate with a protective film inbetween. Then, a short-wavelength energy beam is irradiated to the amorphous film as a first heat treatment, thereby forming a crystalline film made of quasi-single crystal. Subsequently, another short-wavelength energy beam is irradiated to the crystalline film as a second heat treatment in order to selectively fuse and re-crystallize only the grain boundary of the crystalline film and the neighboring region. As a result, a crystalline film with excellent crystallinity can be obtained.

12 Claims, 9 Drawing Sheets

600nm

600nm

METHOD OF MANUFACTURING CRYSTALLINE SEMICONDUCTOR MATERIAL AND METHOD OF MANUFACTURING SEMICONDUCTOR DEVICE

RELATED APPLICATION DATA

The present invention claims priority to Japanese Application No. P2000-251623, filed Aug. 22, 2000, which application is incorporated herein by reference to the extent permitted by law.

BACKGROUND OF THE INVENTION

1. Field of the Invention

The present invention relates to a method of manufacturing a crystalline semiconductor material in which an amorphous semiconductor material is crystallized by a heat treatment and to a method of manufacturing a semiconductor device using the same.

2. Description of the Related Art

Currently, especially in a field of FPD (Flat Panel Display), research and development have been actively proceeded on manufacturing thin film transistors (TFT) using a polycrystalline silicon (polysilicon) film at a low temperature by excimer laser annealing (ELA). Also, early realization of a system on a panel in which LSI (Large Scale Integrated Circuit) is mounted on any substrate is expected. It is necessary to improve the performance of the TFT using the polysilicon (Si) film in a low-temperature process. In order to improve the performance, improvement in crystallinity and increase in grain size of the polysilicon film have been studied.

However, the grain size of the polysilicon film increases and becomes large as the channel length of the TFT, the crystal property of the polysilicon film becomes nonuniform. Therefore, to solve the problem, the utilization of a quasi-single crystal phase in which the neighboring grain boundaries are partially matched, which is more like a single crystal phase than a polycrystal phase is proposed (Japanese Patent Application Laid-open Hei 11-145056). By using the quasi-single crystalline silicon film, scattering barriers of the carrier in the grain boundary can be lowered compared to using the polysilicon film. As a result, the performance of the TFT can be improved.

However, the scattering barrier of the carrier also exist in the grain boundary in the quasi-single crystalline silicon film. Therefore, the uniformity and the improvement in the performance of the TFT cannot be sufficiently achieved. In order to achieve a uniform and high performance TFT, the further lattice matching of the neighboring grain boundaries is required to further improve the crystallinity.

SUMMARY OF THE INVENTION

The invention has been designed to overcome the foregoing problems. The object of the invention is to provide a method of manufacturing a crystalline semiconductor material capable of improving the crystallinity and a method of manufacturing a semiconductor device using the same.

A method of manufacturing a crystalline semiconductor material and a semiconductor device of the invention each includes the steps of forming a quasi-single crystal semiconductor material by conducting a first heat treatment on the amorphous semiconductor material and fusing and re-crystallizing part of the quasi-single crystal semiconductor material by conducting a second heat treatment.

Preferably, the second heat treatment is conducted on the quasi-single crystal semiconductor material at a temperature lower than a melting point of single crystal semiconductor material and higher than a melting point of amorphous semiconductor material. Moreover, it is preferable that only the grain boundary and the neighboring region of the quasi-single crystal semiconductor material are fused and re-crystallized by the second heat treatment.

It is preferable that the short-wavelength energy beam such as an excimer laser beam is irradiated on the quasi-single crystal semiconductor material in the second heat treatment.

The method of manufacturing a crystalline semiconductor material and a semiconductor device of the invention, is performed by heating the amorphous semiconductor material in two steps, the quasi-single crystal being formed and then part of the quasi-single crystal semiconductor material is fused and re-crystallized, whereby its crystallinity is improved.

Other and further objects, features and advantages of the invention will appear more fully from the following description.

DETAILED DESCRIPTION OF THE PREFEERED EMBODIMENTS

Figure 1:
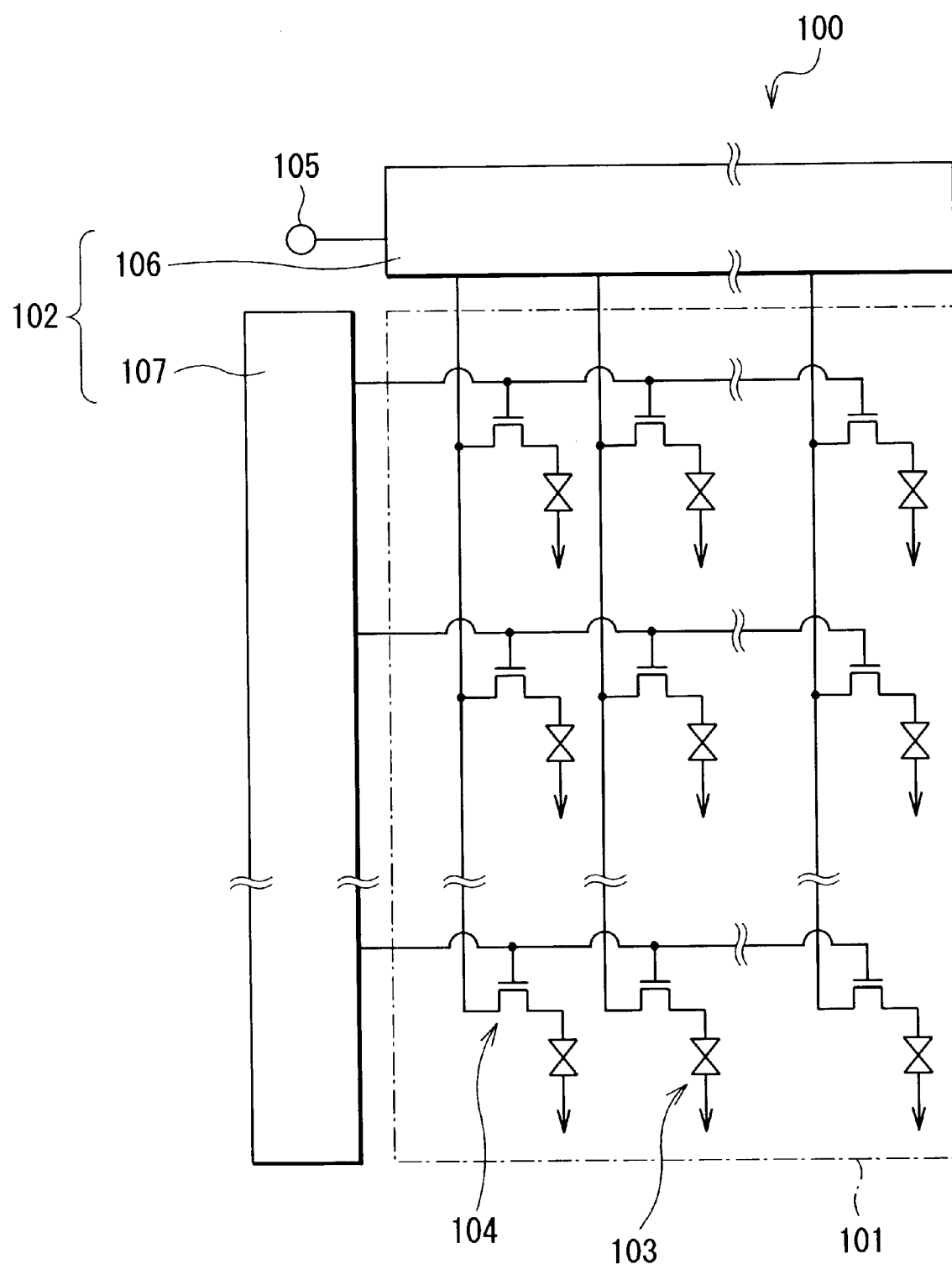
FIG. 1 is a block diagram showing a model structure of a liquid crystal display apparatus manufactured by using a method of manufacturing a crystalline semiconductor material and a method of manufacturing a semiconductor device according to an embodiment of the invention.

In the followings, an embodiment of the invention will be described in detail by referring to the drawings.

In the embodiment hereinafter, a semiconductor device will be described by specifically referring to a case of manufacturing, for example, a liquid crystal display apparatus 100 shown in FIG. 1. The liquid crystal display apparatus 100 comprises a pixel portion 101 and a peripheral circuit 102 provided in the peripheral region of the pixel portion 101 on a substrate (not shown in FIG. 1). In the pixel portion 101, a liquid crystal layer 103 and a plurality of thin film transistors 104 arranged in matrix for driving the liquid crystal layer 103 corresponding to each pixel are formed. The peripheral circuit 102 comprises a video signal terminal 105 and is composed of a horizontal scanning portion (horizontal scanning circuit; signal-electrode drive circuit) 106 which transmits a horizontal scanning signal to the pixel portion 101 along with an inputted image signal, and a vertical scanning portion (vertical scanning circuit; scanning-electrode drive circuit) 107 which transmits a vertical scanning signal to the pixel portion 101.

In the liquid crystal display apparatus 100, the image signal is transmitted to the horizontal scanning portion 106 via the video signal terminal 105 and then the horizontal scanning signal together with the image signal is transmitted from the horizontal scanning portion 106 to the thin film transistor 104 in each pixel of the pixel portion 101. The vertical scanning signal is transmitted from the vertical scanning portion 107 to the thin film transistors 104 in each pixel of the pixel portion 101. Thereby, switching of the liquid crystal layer 103 is controlled so that image is displayed.

Figure 2A:
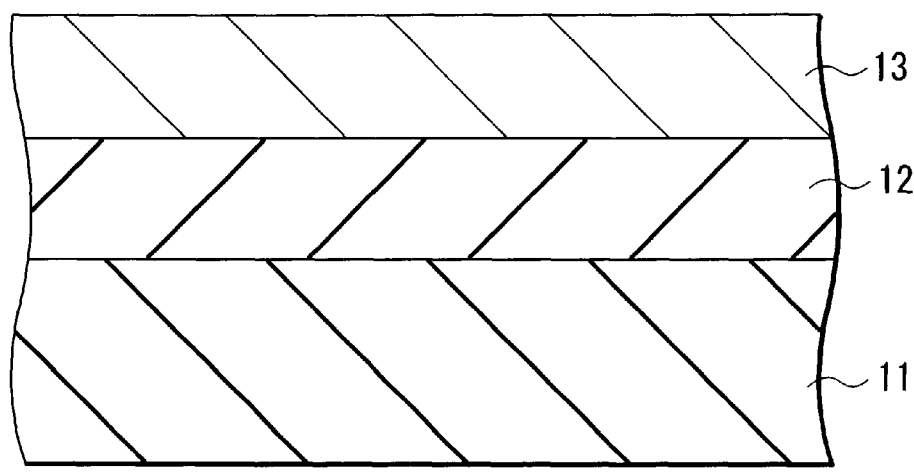
FIGS. 2A and 2B are cross sections showing each step in a method of manufacturing a crystalline semiconductor material.
Figure 2A:

FIGS. 2A and 2B to FIGS. 5A and 5B show the method of manufacturing a crystalline semiconductor material according to the embodiment of the invention in the order of the manufacturing steps. First, as shown in FIG. 2A, an amorphous film 13 made of silicon is formed on an insulating substrate 11 made of, for example, glass with a protective film 12 made of silicon dioxide ($SiO_2$) having a thickness of 40 nm in a stacking direction (in the followings, simply referred to as thickness) inbetween. The protective film 12 is for preventing the amorphous film 13 (that is, crystalline films 14 and 15 in the later process) from being contaminated by the substrate 11, and is formed by, for example, CVD (Chemical Vapor Deposition) or sputtering. The protective film 12 may have a configuration in which, for example, a silicon nitride (SiN) film and silicon dioxide ($SiO_2$) film are stacked.

The amorphous film 13 is formed by, for example, CVD, plasma CVD (PECVD; Plasma Enhanced Chemical Vapor Deposition), or sputtering. Preferably, the thickness of the amorphous film 13 is, for example, from 10 nm to 100 nm, both inclusive, and more preferably from 15 nm to 75 nm, both inclusive. This enables to obtain the excellent crystalline film 14 in the later process of crystallization. In this embodiment, the amorphous film 13 is formed with 40 nm thick.

When the amorphous film 13 is formed by plasma CVD, a large amount of hydrogen is contained in the amorphous film 13. Therefore, it is preferable to remove hydrogen by, for example, a heat treatment for two hours at 450° C. or rapid thermal annealing (RTA) with ultraviolet after forming the amorphous film 13.

Figure 2B:
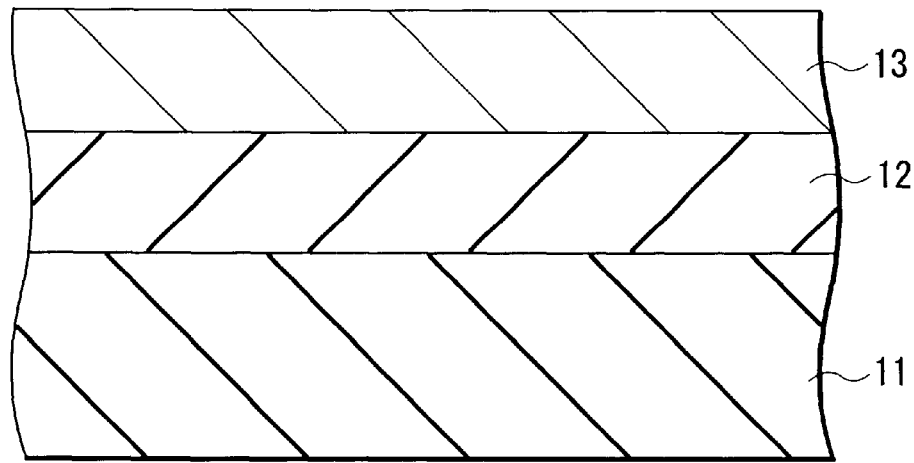

Next, as shown in FIG. 2b, a first heat treatment is conducted by, for example, irradiating a short-wavelength energy beam $E_1$ to the amorphous film 13 in a nitrogen atmosphere. The heating temperature of the amorphous film 13 is preferable to be higher than a melting point (about 1200° C.) of amorphous Silicon. An example of the short-wavelength energy beam $E_1$ is a XeCl excimer laser beam with a wavelength of 308 nm. The short-wavelength energy beam $E_1$ may be irradiated as a so-called line beam or a large area beam.

For example, in the case of irradiating a line beam, it is irradiated as a pulsed laser beam under the irradiation condition shown below. The energy density is the value per pulse.

Irradiation Condition

| Pulse Width | 20 nsec |
|---|---|
| Pulse Frequency | 200 Hz |
| Energy Density | about 250 mJ/cm$^2$ |
| Number of Irradiation | 100 times |

Figure 3:
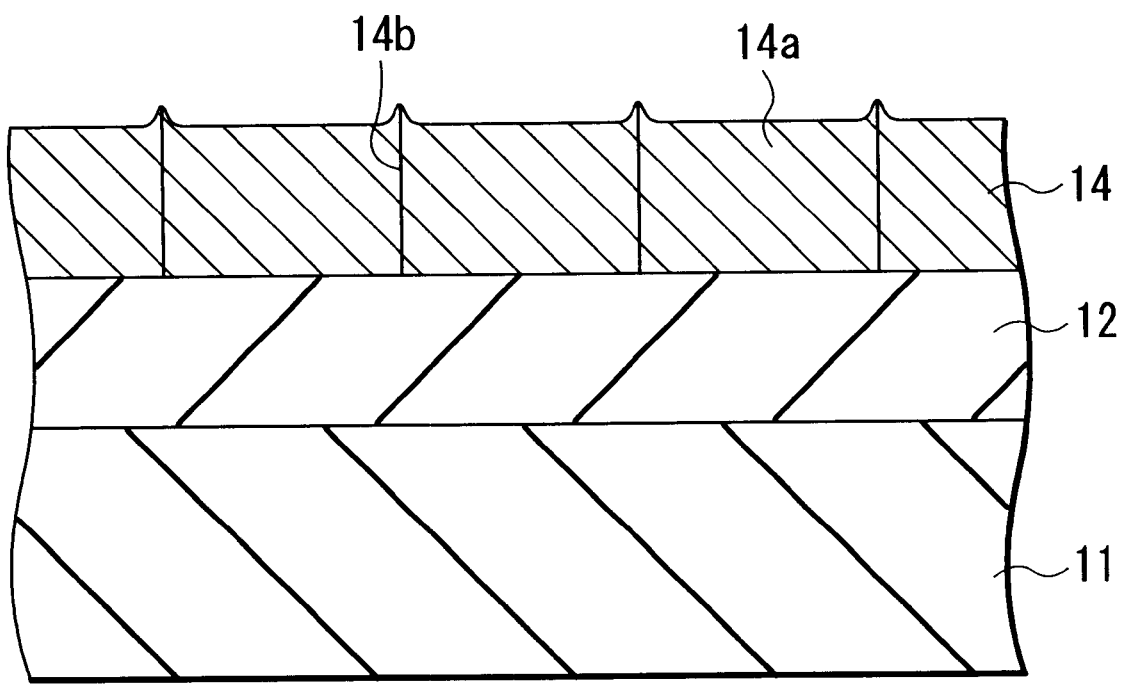
FIG. 3 is a cross section showing a step following the steps shown in FIGS. 2A and 2B.
Figure 4A:
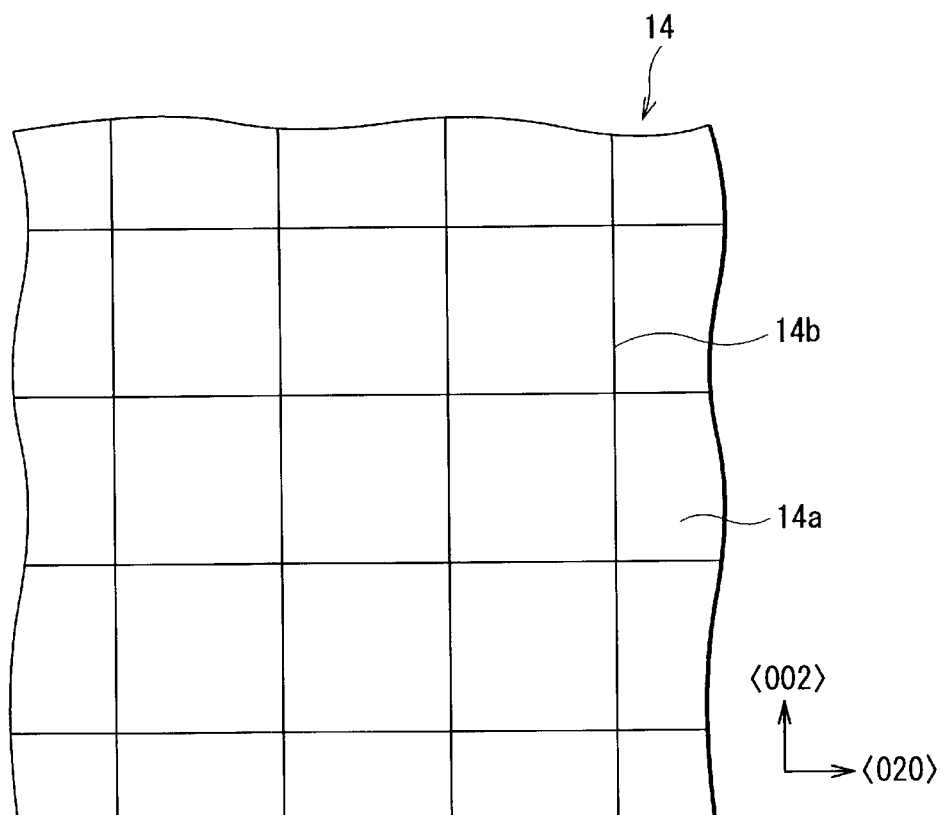
FIGS. 4A and 4B are a plan view and a structural figure of energy potential for describing the state shown in FIG. 3.
Figure 4B:
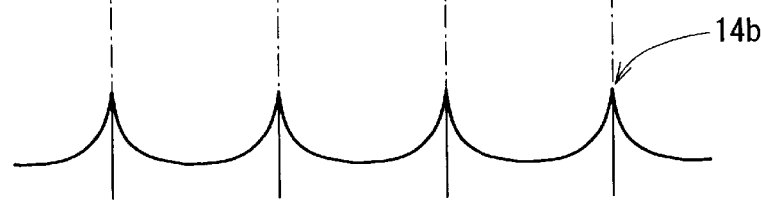

Thereby, as shown in FIG. 3, for example, the amorphous film 13 crystallizes and becomes the crystalline film 14 of quasi-single crystal. The quasi-single crystal is formed of a plurality of crystal grains each of which is a single crystallite. The crystal grains are preferentially-oriented in a direction of one crystallographic plane and the neighboring crystal grains are lattice-matched at least in part of the grain boundary (Japanese Patent Application Laid-open Hei 11-145056). In the embodiment, as shown in FIG. 4A, for example, a group of crystal grains 14a of almost square single crystallite preferentially-oriented in the {100} direction is arranged two-dimensionally in grating, and the crystalline film 14 is formed of As shown in FIG. 3, for example, the grain boundary 14b protrudes into the crystalline film 13 and dangling bonds remain in the grain boundary 14b. As a result, in the crystalline film 14, as shown in FIG. 4B, for example, the energy potential of the grain boundary 14b increases and the scattering barrier of the carrier become high.

In the process of forming the quasi-single crystal in the first heat treatment, the short-wavelength laser beams irradiated on and scattered off the surface of the amorphous semiconductor, interfere with each other, whereby periodic thermal distribution is formed in the amorphous semiconductor. It is considered that this periodic thermal distribution plays an important role in forming the quasi-single crystal. That is, the short-wavelength laser beam is a substantially linearly polarized light. The short-wavelength laser beam which has perpendicularly entered the substrate is scattered by asperities of the surface thereof. The scattered lights spread as spherical waves. A light intensity distribution is formed in accordance with the interference condition of the polarized components of the incident light and the scattered light. At a point which is away from the scattering source by integer times of the wavelength, light intensity becomes strong due to the interference. In the direction to which lights are strongly polarized, additional asperities are formed with a periodicity of the laser beam wavelength as the crystal growth of the semiconductor proceeds.

These additional periodic asperities cause scattering. As the shot number of the short-wavelength laser beam increases, crystallization proceeds in a distinct lattice pattern with the wavelength spacings (grain size). Crystal growth starts from the points where energy is low in the lattice-like energy intensity pattern, and protrusions are formed where each crystal grain meets, thus asperities appear. When the lattice thermal distribution is uniform, and the state of the phase boundary of the fused solution and the substrate is uniform, each crystal grain grows with the same crystallographic orientation, thus a so-called quasi-single crystal is grown as a whole.

Figure 5A:
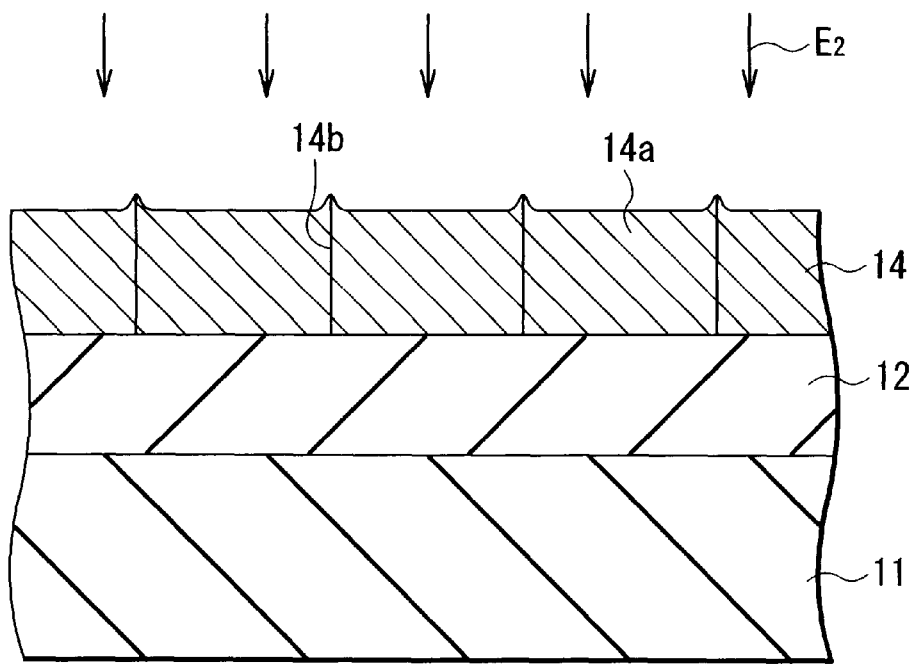
FIGS. 5A and 5B are cross sections showing a step following the step shown in FIG. 3.
Figure 5B:
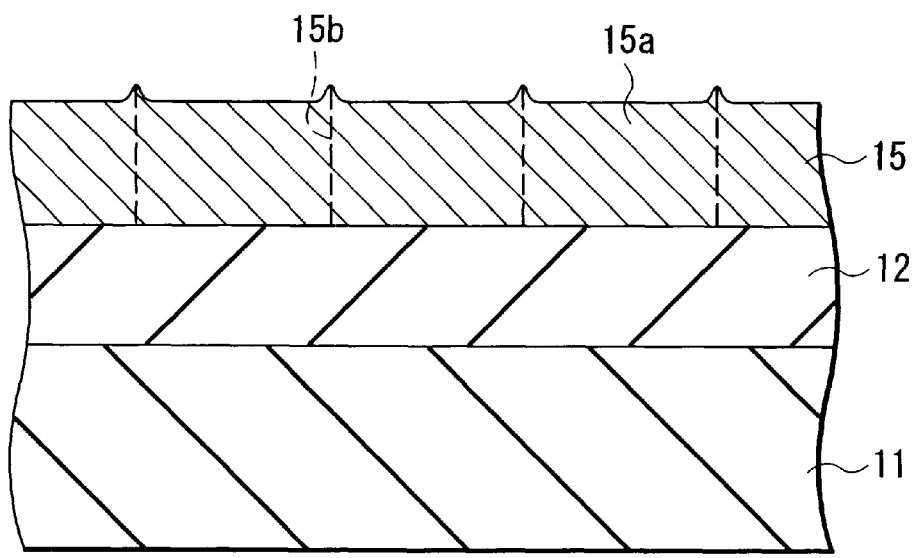
Figure 6A:
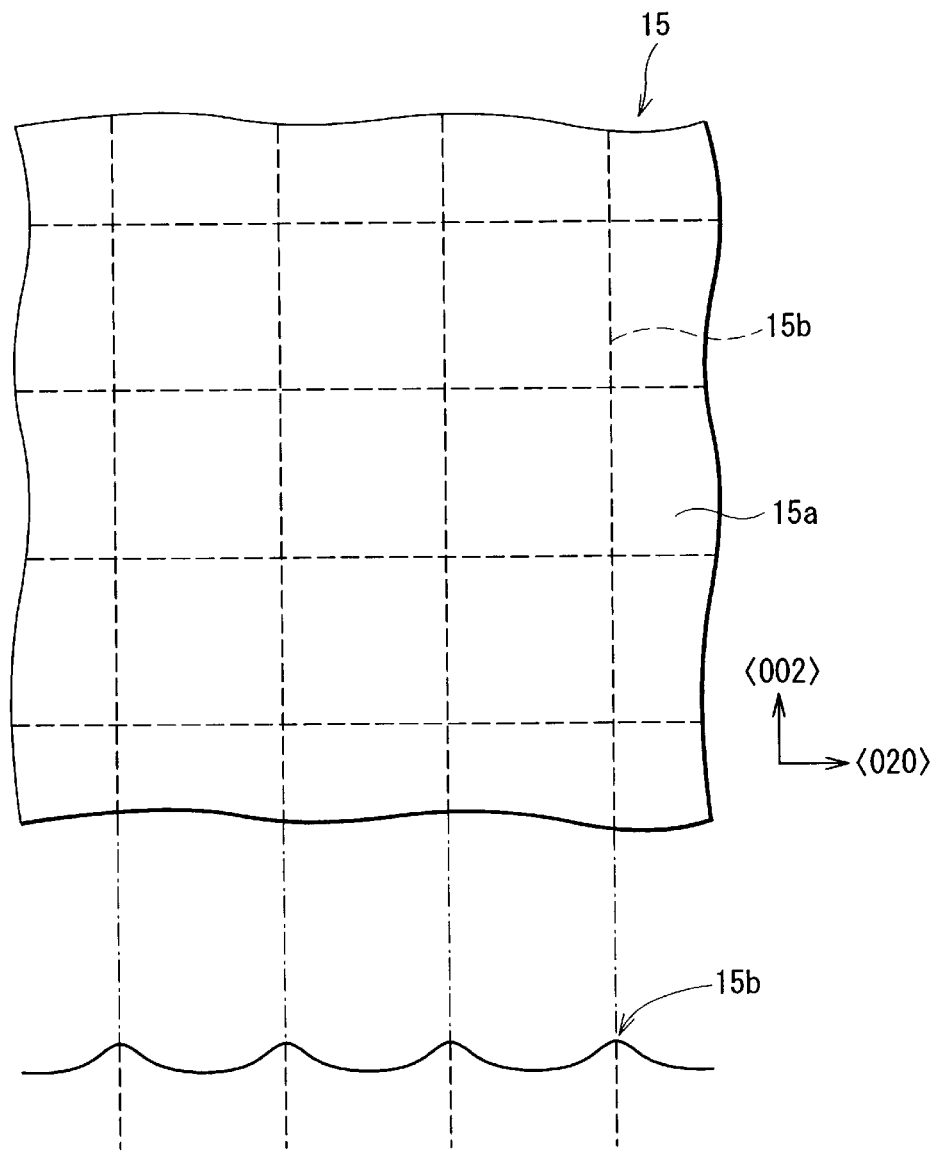
FIGS. 6A and 6B are a plan view and a structural figure of energy potential for describing the step shown in FIG. 5B.
Figure 6B:
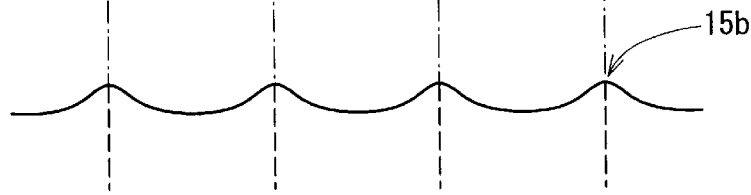

Then, as shown in FIG. 5A, a second heat treatment is conducted by, for example, irradiating a short-wavelength energy beam $E_2$ to the crystalline film 14 in a nitrogen atmosphere. The heating temperature of the crystalline film 14 is preferable to be higher than a melting point (about 1200° C.) of amorphous silicon and lower than a melting point (1415° C.) of single crystal silicon. Since the unbonded crystal grains of the grain boundary 14b of the crystalline film 14 is considered to be amorphous as a defect, only the grain boundary 14b and the neighboring region in the crystalline film 14 can be selectively fused by the heat treatment at the temperature lower than the melting point of single crystal. As a result, as shown in FIG. 5B, for example, the crystalline film 14 is fused and recrystallized only in the grain boundary 14b and the neighboring region and becomes a crystalline film 15 with improved crystallinity. In the crystalline film 15, as shown in FIGS. 6A and 6B, compared with the crystalline film 14, a grain boundary 15b is more lattice matched, the energy potential of the grain boundary 15b decreases more, and the scattering barriers of the carrier become lower.

Figure 7A:
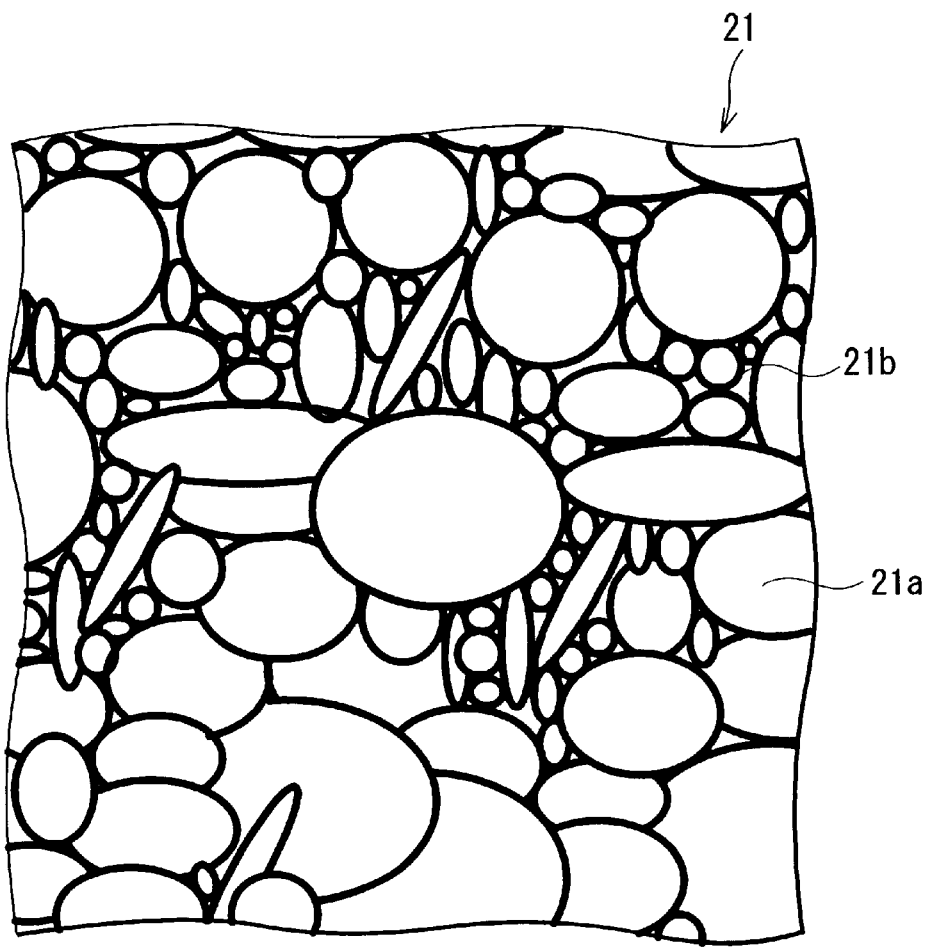
FIGS. 7A and 7B are a plan view and a structural figure of energy potential for describing the state of the crystal grains in an ordinary polycrystal film.
Figure 7B:
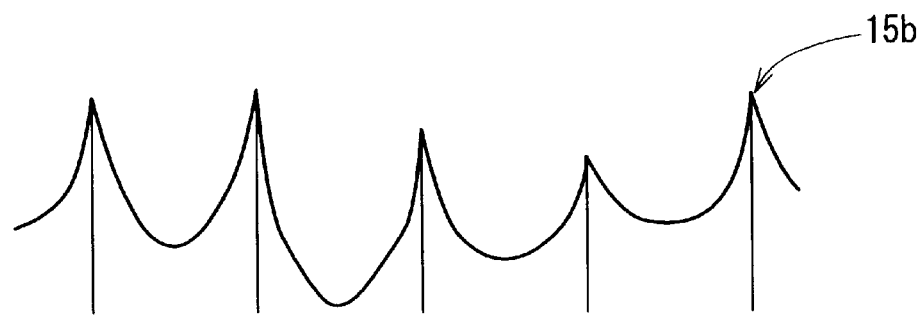

For reference, a state of a crystal grains 21a of a general polycrystalline film 21 is shown in FIG. 7A and the energy potential is shown in FIG. 7B. As shown in the figures, in the polycrystalline film 21, the sizes and orientations of the crystal grains 21a are non-uniform and the energy potential of a grain boundary 21b is extremely high. On the contrary, in the embodiment, the sizes and the orientations of the crystal grains 14a are uniformed by the first heat treatment and the energy potential of the grain boundary 14b is decreased (see FIGS. 4A and 4B). Then, the crystallinity of the grain boundary 15b and the neighboring region are improved by the second heat treatment, thereby further decreasing the energy potential of the grain boundary 15b (see FIGS. 6A and 6B).

An example of the short-wavelength energy beam $E_2$ irradiated in the second heat treatment is XeCl excimer laser beam with a wavelength of 308 nm like the short-wavelength energy beam $E_1$. The short-wavelength energy beam $E_2$ may be irradiated as a so-called line beam or a large area beam. However, it is preferable to irradiate a large area beam with high-power energy of 10J or more by a pulsed beam. For example, when using an X-ray preionization energy beam generator, the pulse width becomes relatively long such as 150 nsec so that the efficiency of re-crystallization deteriorates. However, it is advantageous to obtain long solidification time and slow solidification speed. This is suitable for improving the crystallinity of the grain boundary 14b.

For example, in the case of irradiating a large area beam, it is irradiated as a pulsed laser beam under the irradiation condition shown below. The energy density is the value per pulse.

Irradiation Condition

| Pulse Width | 150 nsec |
| Pulse Frequency | 10 Hz |
| Energy Density | 500 mJ/cm² |
| Number of Irradiation | 40 times |

In the second heat treatment, the crystalline film 14 may be heated by other methods such as using an electric furnace or a lamp instead of irradiating the short-wavelength energy beam $E_2$. However, the method of irradiating an energy beam is preferable since energy is directly absorbed in the crystalline film 14 and the crystalline film 14 can be locally fused, thereby obtaining a crystalline film 15 with high crystallinity. Also, a heat treatment using a lamp is preferable since the heating temperature of the crystalline film 14 can be controlled precisely to be lower than a melting point of a single crystal.

After forming the crystalline film 15 as described, the surface of the crystalline film 15 may be planarized by CMP (Chemical Mechanical Polish) if necessary. It is because the protrusions produced at the time of forming the crystalline film 14 may remain on the surface of the crystalline film 15. Then, the step of forming TFT and the step of manufacturing a liquid crystal display device and the like are performed by the publicly known methods. These steps include the steps of forming a gate oxidation film after separating the device, forming a source region and a drain region after forming a gate electrode, forming an insulating interlayer, forming a contact hole, metal wiring, forming ITO (Indium-Tin Oxide: a mixed film of indium-tin oxide), and sealing in a liquid crystal. Thereby, the steps of a method of manufacturing a polycrystalline film and a method of manufacturing a semiconductor device according to the embodiment are completed and a semiconductor device shown in FIG. 1 is formed.

In the embodiment, as described, the amorphous film 13 is heated in a plurality of steps. Therefore, the amorphous film 13 is crystallized to form the crystalline film 14, part of the crystalline film 14 is re-fused and then recrystallized to form the crystalline film 15. This obtains a crystalline film 15 having an excellent crystallinity. As a result, a uniform TFT with high performance can be formed on a large-area substrate. In other words, a high-quality image can be achieved in a flat display apparatus, and a paper-like display and system on a panel mounted with an LSI can be achieved.

After forming the crystalline film 14 of quasi-single semiconductor crystal by conducting the first heat treatment on the amorphous film 13, part of the crystalline film 14 is fused and re-crystallized by conducting the second heat treatment on the crystalline film 14 to form the crystalline film 15. This improves the crystallinity of the grain boundary 15b and the neighboring region. As a result, the energy potential of the grain boundary 15b can decrease and the scattering barriers of the carrier can lower.

Also, if the second heat treatment is conducted on the crystalline film 14 at the temperature lower than a melting point of the single crystalline film and higher than a melting point of the amorphous film, the grain boundary 14b and the neighboring region of the crystalline film 14 can be selectively fused. As a result, the crystallinity of the crystalline film 15 can be easily improved.

In addition, if the second heat treatment is conducted by irradiating the energy beam $E_2$ to the crystalline film 14, the crystalline film 14 can be locally fused so that the crystalline film 15 with further improved crystallinity can be obtained.

The invention has been described by referring to the embodiment. However, the invention is not limited to the above-mentioned embodiment but various modifications are possible. For example, in the above-mentioned embodiment, the amorphous film 13 is heated in the two separate steps of the first heat treatment and the second heat treatment. However, it can be heated in three steps or more.

Figure 8:
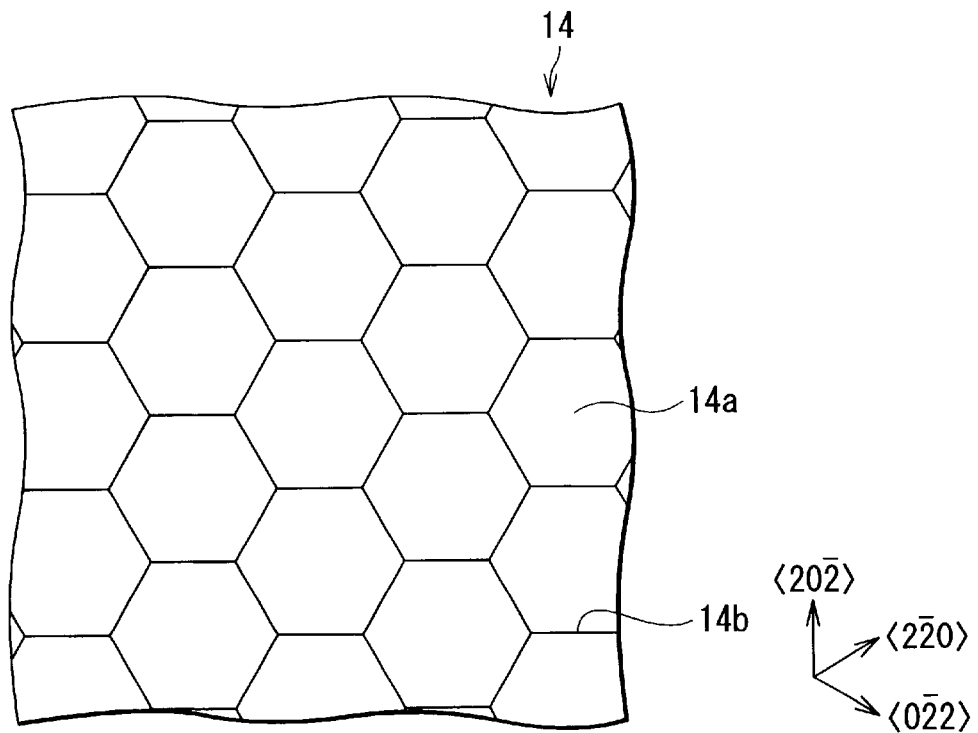
FIG. 8 is a plan view showing a modification of the invention.
Figure 9:
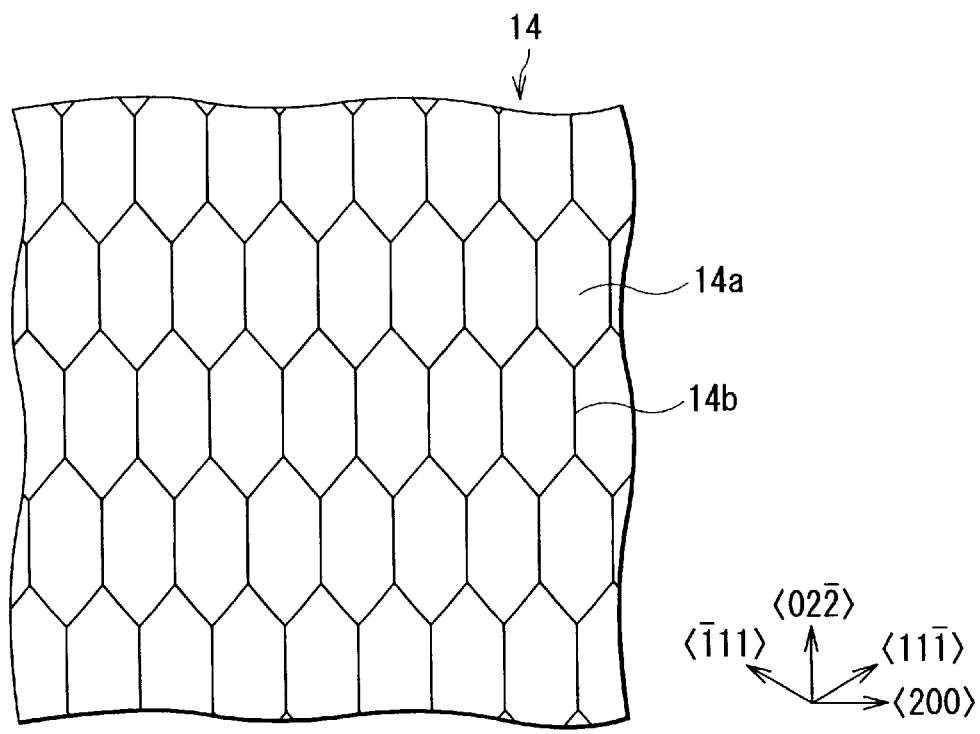
FIG. 9 is a plan view showing another modification of the invention.

Also, in the embodiment, as shown in FIG. 4A, for example, the crystalline film 14 is formed of quasi-single crystal in which a group of crystal grains 14a of almost square single crystallite preferentially-oriented in the {100} direction are arranged two-dimensionally in a grid pattern by the first treatment. However, a crystalline film in which grains are preferentially-oriented in other direction may be formed. For example, as shown in FIG. 8, the crystalline film 14 in which a group of crystal grains 14a of almost hexagonal single crystallite preferentially-orientated in the {111} direction are arranged two dimensionally in a hexagonal pattern, or as shown in FIG. 9, the crystalline film 14 in which a group of crystal grains 14a of almost hexagonal single crystallite preferentially-orientated in the {110} direction are arranged two dimensionally in a hexagonal pattern may be formed. In both of the cases, the same effects as in the above-mentioned embodiment can be obtained.

Furthermore, in the above-mentioned embodiment, the case of manufacturing the crystalline film 15 made of silicon, that is, a crystalline semiconductor material, is described. However, the invention can also be applied to other cases such as manufacturing other crystalline semiconductor materials. Especially, in the case of manufacturing other covalent bond semiconductor having a diamond crystal structure, typically the crystalline semiconductor material made of other IV-group semiconductors, the invention is applicable in the same manner as in the above-mentioned embodiment. Examples of IV group semiconductors are elementary semiconductors such as silicon (Si), germanium (Ge), carbon (C), and a semiconductor made of at least one kind selected from the group consisting of silicon, germanium and carbon (C), such as SiGe or SiC.

In addition, in the above-mentioned embodiment, the energy beam $E_1$ is irradiated to the amorphous film 13 as the first heat treatment. However, the heat treatment may be conducted by other methods such as using a general electric heating furnace (diffusion furnace) for general purpose use or a lamp.

EXAMPLE

Figure 10:
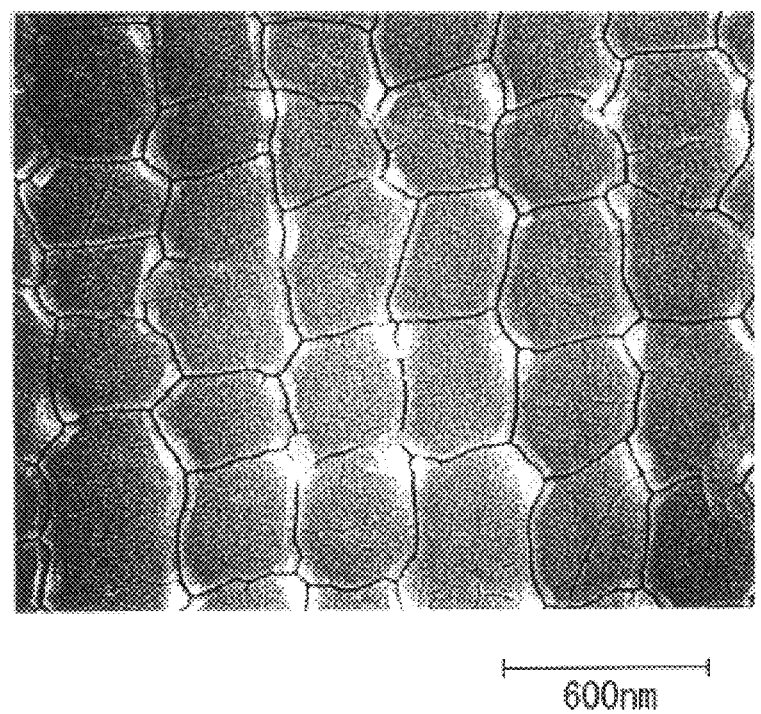
FIG. 10 is a SEM image after conducting a first heat treatment.

FIG. 10 shows a scanning electron microscope (SEM) image of the quasi-single crystal obtained by conducting the first heat treatment under the following condition.
Structure of the Sample
    amorphous silicon film (40 nm in thickness)/SiO$_2$ film (200 nm in thickness)/glass substrate
Irradiation Condition

| Pulse Width | 20 nsec |
| Pulse Frequency | 200 Hz |
| Energy Density | 350 mJ/cm$^2$ |
| Number of Irradiation | 20 times |

Figure 11:
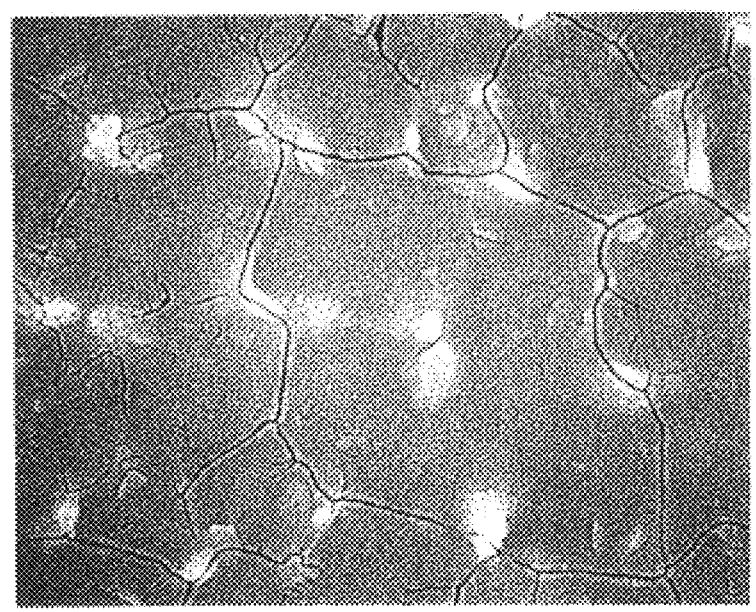
FIG. 11 is a SEM image after conducting a second heat treatment.

FIG. 11 is a SEM image after conducting the second heat treatment under the following condition. FIG. 11 shows that part of the grain boundary is fused so that the grain size becomes larger, whereby re-crystallization occurs.
Irradiation Condition

| Pulse Width | 150 nsec |
| Pulse Frequency | 10 Hz |
| Energy Density | 530 mJ/cm$^2$ |
| Number of Irradiation | 20 times |

According to the method of manufacturing a crystalline semiconductor material of the present invention, after forming a crystalline semiconductor material made of quasi-single crystal by conducting the first heat treatment on an amorphous semiconductor material, part of the crystalline semiconductor material is fused and re-crystallized by conducting the second heat treatment on the crystalline semiconductor material. This makes it possible to improve the crystallinity of the grain boundary and the neighboring region. As a result, the energy potential of the grain boundary can decrease and the scattering barriers of carrier can lower.

Further, the crystalline semiconductor material is heated with a temperature lower than a melting point of the single crystal semiconductor material and higher than a melting point of the amorphous semiconductor material as the second heat treatment. Therefore, the grain boundary and the neighboring region can be selectively fused. As a result, the crystallinity can be easily improved.

Furthermore, an energy beam is irradiated on the crystalline semiconductor material as the second heat treatment. As a result, the crystalline semiconductor material can be locally fused so that a crystalline semiconductor material with improved crystallinity can be obtained.

According to the method of manufacturing a semiconductor device of the invention, the method employs the method of manufacturing a crystalline semiconductor material of the invention. Therefore, a uniform TFT with high performance can be formed on a large area substrate. As a result, a high-quality image can be achieved in a flat display apparatus, and a paper-like display and system on a panel mounted with an LSI can be achieved.

Obviously many modifications and variations of the present invention are possible in the light of above teachings. It is therefore to be understood that within the scope of the appended claims the invention may be practiced otherwise than as specifically described.

What is claimed is:

1. A method of manufacturing a crystalline silicon semiconductor material, comprising the steps of:
    forming a quasi-single crystal silicon semiconductor material by conducting a first heat treatment with a short-wavelength energy beam irradiation on an amorphous silicon semiconductor material at a temperature higher than a melting point of said amorphous silicon semiconductor material; and
    fusing and re-crystallizing the quasi-single crystal silicon semiconductor material by conducting a second heat treatment with a short-wavelength energy beam irradiation at a temperature lower than a melting point of a single crystal silicon semiconductor material and higher than a melting point of the amorphous silicon semiconductor material.

2. The method of manufacturing a crystalline silicon semiconductor material as claimed in claim 1, wherein only a grain boundary and a neighboring region of the quasi-single crystal semiconductor material are selectively fused and recrystallized by the second heat treatment.

3. The method of manufacturing a crystalline silicon semiconductor material as claimed in claim 1, wherein the energy beam in the first heat treatment is an excimer laser.

4. The method of manufacturing a crystalline silicon semiconductor material as claimed in claim 1, wherein the energy beam in the second heat treatment is an excimer laser.

5. A method of manufacturing a crystalline silicon semiconductor device, comprising the steps of:
    forming a quasi-single crystal silicon semiconductor material by conducting a first heat treatment with a short-wavelength energy beam irradiation on an amorphous silicon semiconductor material at a temperature higher than a melting point of said amorphous silicon semiconductor material; and
    selectively fusing and recrystallizing a grain boundary and the neighboring region of the quasi-single crystal silicon semiconductor material by conducting a second heat treatment with a short-wavelength energy beam irradiation at a temperature lower than a melting point of a single crystal silicon semiconductor material and higher than a melting point of the amorphous silicon semiconductor material.

6. A method of manufacturing a crystalline semiconductor material comprised of a Group IV element having a diamond-type crystal structure of one of Si, Ge, and C, comprising the steps of:

forming a quasi-single crystal semiconductor material by conducting a first heat treatment with a short-wavelength energy beam irradiation on an amorphous semiconductor material at a temperature higher than a melting point of said amorphous silicon semiconductor material; and fusing and re-crystallizing the quasi-single crystal semiconductor material by conducting a second heat treatment with a short-wavelength energy beam irradiation at a temperature lower than a melting point of a single crystal semiconductor material and higher than a melting point of the amorphous semiconductor material.

7. A method of manufacturing a crystalline semiconductor device comprised of a Group IV element having a diamond-type crystal structure of one of Si, Ge, and C, comprising the steps of:

forming a quasi-single crystal semiconductor material by conducting a first heat treatment with a short-wavelength energy beam irradiation on an amorphous semiconductor material at a temperature higher than a melting point of said amorphous silicon semiconductor material; and selectively fusing and recrystallizing only a grain boundary and a neighboring region of the quasi-single crystal semiconductor material by conducting a second heat treatment with a short-wavelength energy beam irradiation at a temperature lower than a melting point of a single crystal semiconductor material and higher than a melting point of the amorphous semiconductor material.

8. The method according to claim 7, wherein said quasi-single crystal semiconductor material is formed of a plurality of crystal grains which are oriented in a direction of one crystallographic plane and neighboring crystals are lattice-matched at least in part of the grain boundary.

9. The method according to claim 1, wherein said melting point of said amorphous silicon semiconductor material is 1200° C. and said melting point of said quasi-single crystal silicon semiconductor material is 1415° C.

10. The method according to claim 5, wherein said melting point of said amorphous silicon semiconductor material is 1200° C. and said melting point of said quasi-single crystal silicon semiconductor material is 1415° C.

11. The method according to claim 6, wherein said melting point of said amorphous silicon semiconductor material is 1200° C. and said melting point of said quasi-single crystal silicon semiconductor material is 1415° C.

12. The method according to claim 7, wherein said melting point of said amorphous silicon semiconductor material is 1200° C. and said melting point of said quasi-single crystal silicon semiconductor material is 1415° C.

* * * * *